(12) United States Patent
Kim et al.

(10) Patent No.: US 9,960,889 B2
(45) Date of Patent: May 1, 2018

(54) METHOD AND APPARATUS FOR PERFORMING INTERLEAVING IN COMMUNICATION SYSTEM

(71) Applicants: Samsung Electronics Co., Ltd., Gyeonggi-do (KR); Research & Business Foundation SUNGKYUNKWAN UNIVERSITY, Gyeonggi-do (KR)

(72) Inventors: Sang-Hyo Kim, Seoul (KR); Hyun-Seok Ryu, Gyeonggi-do (KR); Seung-Hoon Park, Seoul (KR); Peng Xue, Gyeonggi-do (KR); Myung-Hoon Ko, Gyeonggi-do (KR); Kyung-Min Lee, Gyeonggi-do (KR); Min Jang, Seoul (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 107 days.

(21) Appl. No.: 14/932,837

(22) Filed: Nov. 4, 2015

(65) Prior Publication Data

US 2016/0127085 A1 May 5, 2016

(30) Foreign Application Priority Data

Nov. 4, 2014 (KR) .......................... 10-2014-0151940

(51) Int. Cl.
*H03M 13/00* (2006.01)
*H03M 13/27* (2006.01)
(Continued)

(52) U.S. Cl.
CPC .......... *H04L 5/0001* (2013.01); *H03M 13/23* (2013.01); *H03M 13/276* (2013.01); *H03M 13/2757* (2013.01); *H04L 1/00* (2013.01)

(58) Field of Classification Search
None
See application file for complete search history.

(56) References Cited

U.S. PATENT DOCUMENTS

2006/0062314 A1* 3/2006 Palin ................... H04L 27/2626 375/260
2008/0059727 A1* 3/2008 Eroz ................... H03M 13/271 711/157
(Continued)

FOREIGN PATENT DOCUMENTS

KR 10-2009-0024864 3/2009

OTHER PUBLICATIONS

Kusume, et al.; "IDMA vs. CDMA: Analysis and Comparison of Two Multiple Access Schemes"; IEEE Trans. on Wireless Commun. vol. 11, No. 1; Jan. 2, 2012; 10 pages.
(Continued)

*Primary Examiner* — Noel Beharry
*Assistant Examiner* — Nicole King

(57) ABSTRACT

A pre-5G or 5G communication system to be provided for supporting higher data rates beyond a 4G communication system, such as Long Term Evolution (LTE). Disclosed are a method and an apparatus for performing interleaving by using an identical interleaving bit generation method in multiple interleavers included in a communication system. The present disclosure provides a method for interleaving an input bit sequence by an interleaver of a multiple access communication system. The method includes setting a common parameter used by multiple interleavers; setting a unique parameter for the interleaver in view of a correlation between bit sequences which are input to the multiple interleavers; and interleaving the input bit sequence by using prime-power depending on the common parameter and the unique parameter.

16 Claims, 10 Drawing Sheets

(51) Int. Cl.
*H04L 5/00* (2006.01)
*H04W 72/04* (2009.01)
*H04L 1/00* (2006.01)
*H03M 13/23* (2006.01)

(56) References Cited

U.S. PATENT DOCUMENTS

2009/0060094 A1 3/2009 Jung et al.
2014/0119352 A1* 5/2014 Matsumoto ........... H04L 1/0043
370/337

OTHER PUBLICATIONS

Ping, et al.; "A Simple Approach to Near Optimal Multiuser Detection: Interleave-Division Multiple-Access"; IEEE; Mar. 2003; 6 pages.
Ping, et al.; "Interleave-Division Multiple-Access"; IEEE Trans. on Wireless Commun. vol. 5, No. 4; Apr. 4, 2006; 10 pages.
Wu, et al.; "User-Specific Chip-Level Interleaver Design for IDMA Systems"; IEEE Electronic Letters vol. 42, No. 4; Feb. 16, 2006; 2 pages.
Catt, et al.; "WF on Resource Allocation for Type 1 D2D Discovery"; 3GPP TSG RAN WG1 #76; R1-140863; Prague, Czech Republic; Feb. 10-14, 2014; 3 pages.

* cited by examiner

| USER | RANDOM INTERLEAVER | POWER INTERLEAVER | PROPOSED INTERLEAVER |
|---|---|---|---|
| 6 | 6 | 1 | 1 |
| 8 | 8 | 1 | 1 |
| 12 | 12 | 1 | 1 |
| 16 | 16 | 1 | 1 |

FIG.8

| USER | RANDOM INTERLEAVER | POWER INTERLEAVER | PROPOSED INTERLEAVER |
|---|---|---|---|
| 6 | 6 | 21/6=3.5 | 1 |
| 8 | 8 | 63/8=4.5 | 1 |
| 12 | 12 | 78/102=6.5 | 1 |
| 16 | 16 | 136/106=8.5 | 1 |

FIG.9

| SIMULATION ENVIRONMENT | SCENARIO #01 | SCENARIO #02 | SCENARIO #03 |
|---|---|---|---|
| CHANNEL | AWGN | | |
| MESSAGE LENGTH | 1024 | 128 | |
| ERROR CORRECTION CODE | 1/2 CONVOLUTIONAL CODE (THE NUMBER OF MEMORIES: 6, GENERATION POLYNOMIAL $[23,35]_8$) | 1/2 CONVOLUTIONAL CODE (THE NUMBER OF MEMORIES: 6, GENERATION POLYNOMIAL $[31,27]_8$) | |
| ITERATIVE CODE ITERATIVE NUMBER OF TIMES | 4 | 8 | 4 |
| MODULATION SCHEME | QPSK | | |
| ITERATIVE NUMBER OF TIMES OF DECODING | 10 | | |
| THE NUMBER OF MULTI-USERS | 6/7/8/9 | 8/102/106 | 8 |

FIG.10

METHOD AND APPARATUS FOR PERFORMING INTERLEAVING IN COMMUNICATION SYSTEM

CROSS-REFERENCE TO RELATED APPLICATION AND CLAIM OF PRIORITY

The present application is related to and claims benefit under 35 U.S.C. § 119(a) to Korean Application Serial No. 10-2014-0151940, which was filed in the Korean Intellectual Property Office on Nov. 4, 2014, the entire content of which is hereby incorporated by reference.

TECHNICAL FIELD

The present disclosure relates to a method in which multiple interleavers included in a communication system perform interleaving by using an identical interleaving bit generation method, and an apparatus using the same.

BACKGROUND

To meet the demand for wireless data traffic having increased since deployment of 4G (4th-Generation) communication systems, efforts have been made to develop an improved 5G (5th-Generation) or pre-5G communication system. Therefore, the 5G or pre-5G communication system is also called a 'Beyond 4G Network' or a 'Post LTE System.'

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, and large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as advanced access technology have been developed.

Examples of a communication system which is based on a multiple access system including one receiver and multiple transmitters include a typical mobile communication system such as a cellular uplink system, and next-generation communication systems such as a Device-to-Device (D2D) system, an Internet of Things (IOT) system, a Machine-to-Machine (M2M) system, and like.

The multiple access system uses an Interleave Division Multiple Access (IDMA) technique to distinguish between the multiple access user equipments (i.e., the transmitters). The IDMA technique is wireless communication technology for a multiple access system in which the one receiver and the multiple transmitters share radio resources therebetween and communicate with each other as in the case of Time Division Multiple Access (TDMA), Frequency Division Multiple Access (FDMA), Code Division Multiple Access (CDMA), and the like. The IDMA technique uses a unique interleaver of a user equipment to distinguish the user equipments.

The IDMA technique can be considered as a kind of a CDMA technique in a broad sense. However, the CDMA technique is limited in performance by multiple access interference, inter-symbol interference, and the like, whereas the IDMA technique compensates for disadvantages of the CDMA technique through an iterative multi-user detection technique which is based on a decoding theory of a turbo code. Accordingly, the IDMA technique can be classified as a multiple access technique different from the CDMA technique.

A conventional multiple access technique divides time, a frequency, or a code in order to distinguish between multiple user equipments, and thus the user equipments all use a single common interleaver. However, the IDMA technique uses an identical code in common time-frequency resources, and distinguishes between multiple access user equipments by using an interleaver. Accordingly, the user equipments existing in a system need to user different interleavers. Also, the decoding performance of a communication system can depend on a correlation between bit sequences interleaved between the user equipments.

Therefore, the communication system using the IDMA technique requires a method for efficiently generating interleaved bit sequences by multiple interleavers.

SUMMARY

To address the above-discussed deficiencies, it is a primary object to provide an interleaving method and an interleaving apparatus for generating bit sequences interleaved to enable minimization of the overhead of a system in a communication system.

Also, another aspect of the present disclosure is to provide an interleaving method and an interleaving apparatus for generating optimal interleaved bit sequences according to a correlation between multiple interleaved bit sequences in a communication system.

In accordance with an aspect of the present disclosure, a method for interleaving an input bit sequence by an interleaver of a multiple access communication system is provided. The method includes setting a common parameter used by multiple interleavers; setting a unique parameter for the interleaver in view of a correlation between bit sequences which are input to the multiple interleavers; and interleaving the input bit sequence by using prime-power depending on the common parameter and the unique parameter.

In accordance with another aspect of the present disclosure, an apparatus for interleaving an input bit sequence in a multiple access communication system is provided. The apparatus includes a control unit that sets a common parameter used by multiple interleavers, and sets a unique parameter for the interleaver in view of a correlation between bit sequences which are input to the multiple interleavers; and a generation unit that interleaves the input bit sequence by using prime-power depending on the common parameter and the unique parameter.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 8 is a view illustrating a comparison between a memory usage of a conventional interleaver and that of an interleaver according to an embodiment of the present disclosure;

FIG. 9 is a view illustrating a comparison between the complexity level of a conventional interleaver and that of an interleaver according to an embodiment of the present disclosure; and FIGS. 10, 11A and 11B are views illustrating the estimation of the performance of an interleaver according to an embodiment of the present disclosure.

DETAILED DESCRIPTION

FIGS. 1 through 11B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged telecommunication technologies. Hereinafter, exemplary embodiments of the present disclosure will be described in detail with reference to the accompanying drawings. In the following description, it should be noted that only portions required for comprehension of operations according to the embodiments of the present disclosure will be described and descriptions of other portions will be omitted not to make subject matters of the present disclosure obscure.

The main subject matter of the present disclosure relates to a method for generating an interleaved bit sequence at a low complexity level by using a minimum amount of a memory by each of multiple interleavers in a communication system using an IDMA technique.

To this end, a detailed description will be made of a method and an apparatus for performing interleaving in a communication system using an IDMA technique according to an embodiment of the present disclosure.

Figure 1:
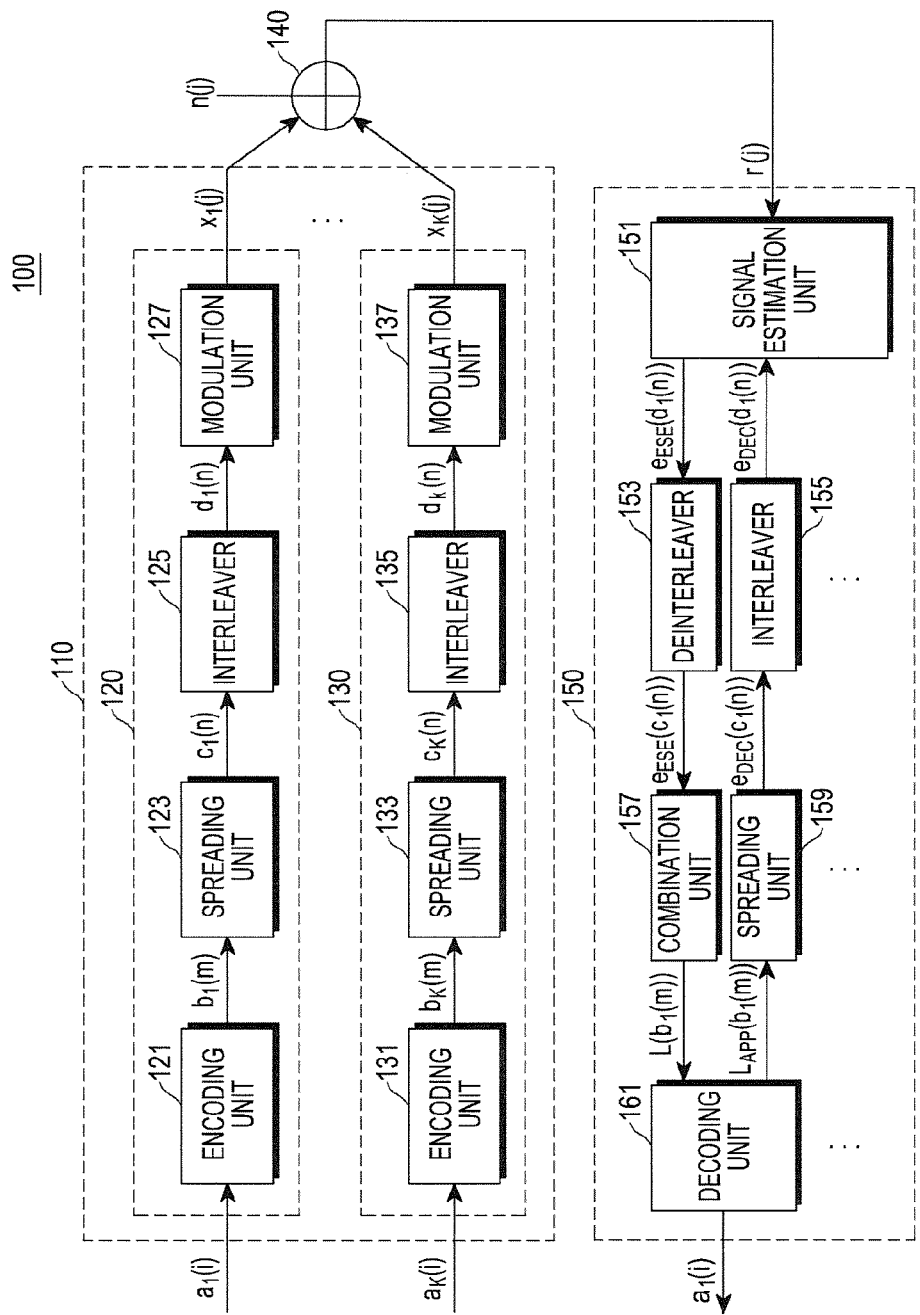
FIG. 1 is a block diagram illustrating a configuration of a communication system using an IDMA technique to which the present disclosure is applied.

FIG. 1 is a block diagram illustrating a configuration of a communication system using an IDMA technique to which the present disclosure is applied.

Referring to FIG. 1, the communication system 100 using the IDMA technique includes a transmission unit 110 and a reception unit 150. Each user terminal independently generates a search signal according to a configuration of the transmission unit 110. Specifically, the transmission unit 110 includes specific configuration units for each user equipment. That is, a transmitter 120 related to a first user equipment includes an encoding unit 121, a spreading unit 123, an interleaver 125, and a modulation unit 127, and a transmitter 130 related to a k-th user equipment includes an encoding unit 131, a spreading unit 133, an interleaver 135, and a modulation unit 137.

For example, in the transmitter 130 related to the k-th user equipment, the encoding unit 131 encodes a message bit sequence $\{a_k(i)\}$ (i=1, 2, . . . , I) by using an error correction code, such as a convolutional code and the like. Then, the spreading unit 133 encodes a sequence $\{b_k(m)\}$ (m=1, 2, . . . , M) obtained after encoding by using a repetition code, and generates a codeword $\{c_k(n)\}$ (n=1, 2, . . . , N) which has a low coding rate as a whole. In the present example, a coding rate of the error correction code and that of the repetition code are respectively represented as $R_c$ and $R_r$, and are respectively defined by $R_c=I/M$ and $R_r=M/N$. Also, the interleaver 135 interleaves the codeword $\{c_k(n)\}$ generated through an encoding process of the encoding unit 131 and the spreading unit 133, and the modulation unit 137 modulates the interleaved codeword into a symbol sequence $\{x_k(j)\}$ (j=1, 2, . . . , J) in a transmissible format.

In the present example, a case is considered in which an interleaver of each user equipment is generated randomly and independently of an interleaver of another user equipment. According to such a characteristic of the interleavers, in the communication system 100 using the IDMA technique, all of the user equipments employ the identical encoding unit, but the reception unit can distinguish between the user equipments by using a unique interleaver of each user equipment. Also, the reception unit 150 can perform a relatively simple multi-user detection technique according to a unique characteristic of the interleaver that spreads the encoded sequence $\{c_k(n)\}$ and causes adjacent bits to have a low correlation therebetween.

The transmission unit 110 simultaneously transmits search signals, that a K number of user equipments have independently generated, to the reception unit 150 through a multiple access channel 140. A signal r(J), that the reception unit 150 receives through the multiple access channel 140, can be represented by Equation 1 below.

$$r(j) = \sum_{k=1}^{K} h_k x_k(j) + n(j), \quad (1)$$

In Equation 1, $h_k$ represents a fading channel coefficient between the transmitter and a receiver related to the k-th user equipment, and n(j) represents Additive White Gaussian Noise (AWGN) having a means of 0 and a variance of $\sigma_n^2$.

As defined by Equation 1, the reception unit 150 receives signals from the multiple user equipments in a state where the signals overlap each other, and the signals from the user equipments other than the k-th user equipment can be considered as multiple access interference, from the viewpoint of the reconstruction of the signal from the k-th user equipment. A received signal considering multiple access interference from the viewpoint of the signal from the k-th user equipment can be represented by Equation 2 below.

$$\begin{aligned} r(j) &= h_k x_k(j) + \sum_{m \neq k} h_m x_m(j) + n(j), \\ &= h_k x_k(j) + z_k(j), \end{aligned} \quad (2)$$

In Equation 2, $z_k(j)$ is obtained by combining a thermal noise from the reception unit 150 with interferences from the other user equipments except for the k-th user equipment, and represents distortion to the k-th user equipment.

Referring to FIG. 1, in the reception unit 150, a receiver that receives a signal from the first user equipment includes a signal estimation unit 151, a deinterleaver 153, an interleaver 155, a combination unit 157, a spreading unit 159, and a decoding unit 161. Also, although the reception unit 150 is schematically illustrated in FIG. 1, the estimation of a K number of transmission signals included in the reception unit 150 is performed identically to an operation of estimating a signal from the first user equipment.

The receiver that estimates a signal from the k-th user equipment detects and removes multiple access interference as accurately as possible, and performs a process for iterative detection and decoding using a decoding theory of a turbo code in order to successfully reconstruct the signal from the k-th user equipment. When the receiver perfectly detects and removes the multiple access interference, the multiple access channel 140 becomes a single-user channel in which only the k-th user equipment simply exists. In this situation, it is possible to obtain performance achievable on a single-user equipment channel. Accordingly, decoding performance on the single-user equipment channel can be considered as an upper bound of decoding performance that the communication system 100 using the IDMA technique can obtain.

The signal estimation unit 151 included in the reception unit 150 is an Elementary Signal Estimator (ESE), and generates an extrinsic Log-Likelihood Ratio (LLR) of a received signal $x_k(j)$. Then, the deinterleaver 153 and the combination unit 157 perform a process for deinterleaving and combination with respect to the LLR value, and delivers, to the decoding unit 161, a result of performing the process. The decoding unit 161 can be implemented by an A Posteriori Probability (APP) DECoder (DEC), and again outputs an extrinsic LLR value of $x_k(j)$, which is calculated by using an LLR value received from the combination unit 157, to the spreading unit 159. Then, the spreading unit 159 and the interleaver 155 perform a process for spreading and interleaving with respect to the LLR value, and delivers, to the signal estimation unit 151, a result of performing the process.

As described above, the reception unit 150 repeats a process for generating and delivering the extrinsic LLR values through the signal estimation unit 151 to the decoding unit 161, and improves the reliability of the extrinsic LLR of $x_k(j)$ through the repeated processes.

The communication system 100 using the IDMA technique illustrated in FIG. 1 can use a random interleaver as the most basic interleaver. Since a unique interleaver of each user equipment performs interleaving optionally and independently, the random interleaver can perform interleaving in a complex interleaving method and can have a high correlation between interleaved bit sequences. For example, in an interleaved bit pattern generated for the first user equipment and an interleaved bit pattern generated for the second user equipment, positions of bit sequences, at which the bit sequences are interleaved, can largely coincide with each other. In this case, message information of the first user equipment is not clearly distinguished from message information of the second user equipment in the communication system using the IDMA technique, so that the overall system performance can be degraded. Also, the reception unit needs multiple memories that are to store all of the respective interleaved bit patterns for the multiple access user equipments. Particularly, these problems become more serious when implementation is limited as in the case of a user equipment.

An interleaver developed to overcome the problems of the random interleaver is a power interleaver. In the case of the power interleaver, the communication system using the IDMA technique requires a master interleaver for interleaved bit sequences for multiple user equipments. The master interleaver basically uses a random interleaver, and generates an interleaved bit sequence unique to a user equipment in such a manner as to change the number of times of interleaving according to a user equipment index on the basis of the master interleaver. For example, the first user equipment performs interleaving once through the master interleaver, and the k-th user equipment performs interleaving by the k number of times through the master interleaver. The reception unit of the communication system using the IDMA technique stores only one random interleaver pattern and a user equipment index, so that the power interleaver can solve a memory problem occurring when the random interleaver is used. However, the power interleaver is problematic in that the number of times of interleaving for generating an interleaved bit sequence unique to a user equipment becomes larger as the total number of user equipments increases. Specifically, when the total number of user equipments is equal to K, the average number of times of interleaving per user equipment increases by $$\frac{K \times (K+1)}{2 \times K} = \frac{K+1}{2}$$

according to K. Accordingly, the communication system using the IDMA technique requires a new interleaver that can overcome the memory problem of the receiver and the generation complexity level of the transmitter.

To this end, an embodiment of the present disclosure provides a method and an apparatus for performing interleaving formulated by using a minimum number of parameters in the communication system using the IDMA technique. Specifically, an embodiment of the present disclosure provides a method for generating an interleaved bit sequence unique to a user equipment in such a manner as to change a power of a prime number in the communication system using the IDMA technique, and a Prime-Power (PP) interleaver using the same.

Figure 2:
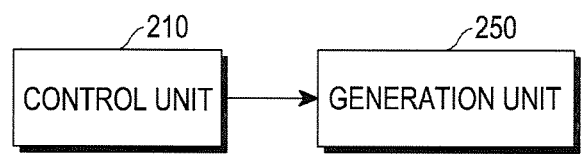
FIG. 2 is a block diagram illustrating a configuration of an interleaver according to an embodiment of the present disclosure.

FIG. 2 is a block diagram illustrating a configuration of an interleaver according to an embodiment of the present disclosure.

Referring to FIG. 2, the interleaver, according to an embodiment of the present disclosure, includes a control unit 210 and a generation unit 250.

The control unit 210 sets common parameters between user equipments that perform interleaving. The common parameters between the user equipments are a length N and a prime seed value p of each interleaver used by the transmission unit 110. In the present example, regardless of the user equipments, the lengths N's all have an identical value and the prime seed values p's all have an identical value. Accordingly, all of the transmitters and receivers within the system can previously share the length N and the prime seed value p.

Then, the control unit 210 sets a unique parameter of the relevant user equipment. The unique parameter is value k representing the value of a power, which is a prime number, and signifies an index of an interleaver. Specifically, the control unit 210 sets k by using a look-up table which includes a correlation between bit sequences according to a prime number. In the present example, the control unit 210 can receive the index of the interleaver from the receiver.

Specifically, a correlation between interleaved bit sequences generated by the interleavers of the transmission unit affects the performance of the communication system. As an example, when at least two transmitters use an identical interleaved bit sequence in the communication system, a receiver may not distinguish between signals from the transmitters that use the identical interleaved bit sequence, so as to significantly reduce the overall performance of the system.

Accordingly, an embodiment of the present disclosure proposes a method for setting an index of an interleaver so that interleavers do not generate an identical interleaved bit sequence. To this end, in order to control the interleavers to generate different interleaved bit sequences, the control unit 210 predicts a correlation between interleaved bit sequences to be generated, in view of a correlation between bit sequences which are input to the respective multiple transmitters. Then, the control unit 210 sets an index of an interleaver so that the interleaved bit sequences to be generated have the predicted correlation.

Various methods can be used to identify the correlation between the bit sequences, and the control unit 210 uses the following method as an example.

The control unit 210 determines a correlation between input bit sequences by using Equation 3 below.

$$C(\pi_i, w, \pi_j, v) = \langle \pi_i(f(w)), \pi_j(f(v)) \rangle \quad (3)$$

In Equation 3, w and v represent optional bit sequences, and f represents an iterative symbol and an operation of masking. $\pi_i$ represents an i-th interleaving pattern, and $\langle a, b \rangle$ represents an inner product between sequences (vectors) a and b. Accordingly, a correlation between a bit sequence i and a bit sequence j is expressed by a single value obtained by an inner product, and has a lower correlation as the absolute value of the single value becomes smaller. As an example, a characteristic of the correlation between the input bit sequences and that of the correlation between the interleaved bit sequences are as illustrated in FIG. 3.

Figure 3:
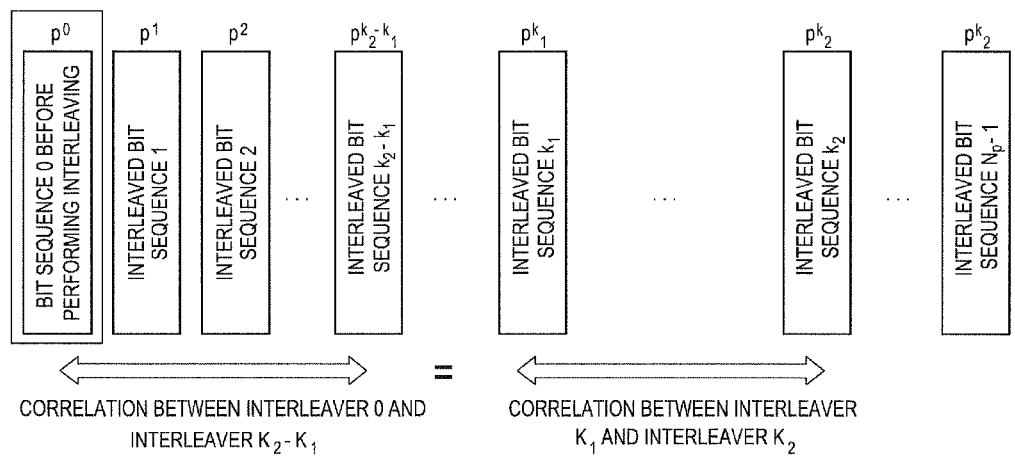
FIG. 3 is a view illustrating a characteristic of a correlation between input bit sequences and a characteristic of a correlation between interleaved bit sequences in an embodiment of the present disclosure.

FIG. 3 is a view illustrating a characteristic of a correlation between input bit sequences and a characteristic of a correlation between interleaved bit sequences in an embodiment of the present disclosure.

Referring to FIG. 3, according to a theory of the power interleaver, the correlation between the interleaved bit sequences is defined as an identical correlation in each predetermined cycle. Specifically, a correlation between an interleaved bit sequence $k_1$ and an interleaved bit sequence $k_2$ is defined as a correlation identical to a correlation between a bit sequence 0 before performing interleaving and an interleaved bit sequence $k_2 - k_1$. As an example, when the bit sequence 0 before performing interleaving and an interleaved bit sequence 4 have a correlation close to 0, the interleaved bit sequence 4 and an interleaved bit sequence 8 also have the identical correlation.

Accordingly, a correlation between bit sequences according to a prime value with respect to a transmission block length and the iterative number of times of an iterative code, which are agreed upon by standards, can be pre-stored in the form of a look-up table. Therefore, the control unit 210 can set an index of an interleaver to be used, in view of a correlation between bit sequences according to a prime stored in the look-up table.

Referring again to FIG. 2, the generation unit 250 interleaves an input bit sequence by using common parameters and a unique parameter which are set by the control unit 210. Specifically, the generation unit 250 generates an interleaved bit sequence unique to a user equipment by using a power of a prime number according to an index of an interleaver. A detailed operation of the generation unit 250 will be described in an interleaving method illustrated in FIG. 4 below.

Figure 4:
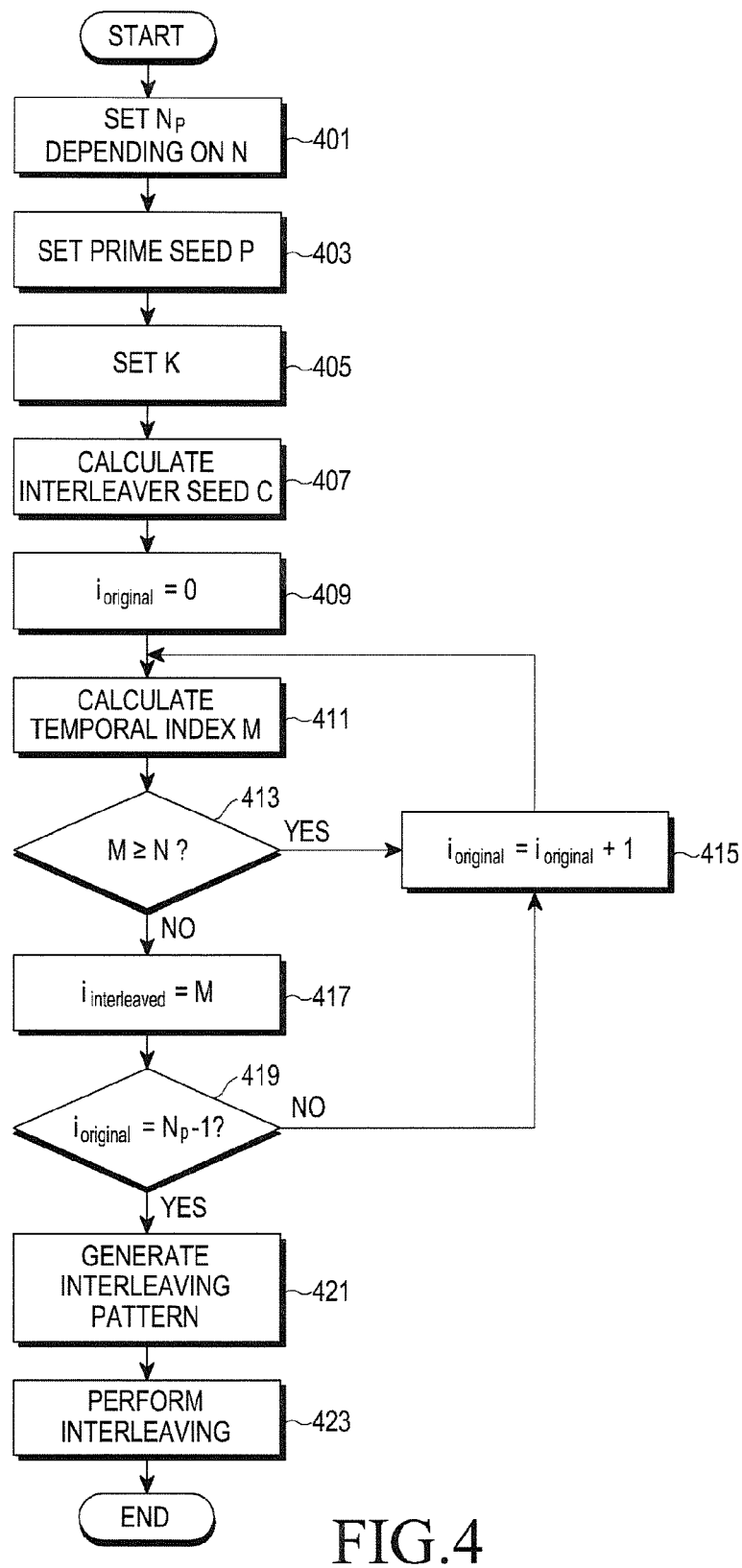
FIG. 4 is a flowchart illustrating an interleaving method according to an embodiment of the present disclosure.

FIG. 4 is a flowchart illustrating an interleaving method according to an embodiment of the present disclosure.

The interleaving method, according to an embodiment of the present disclosure, is for generating an interleaved bit sequence unique to a user equipment. In FIG. 3, $i_{original}$ represents a bit index before performing interleaving, and $i_{interleaved}$ represents a bit index after performing interleaving. Also, N represents the length of each interleaver, and $N_P$ represents the smallest value among prime numbers greater than or equal to N. p represents a single parameter common in the user equipments, and has a prime value. c represents an interleaver seed value, and has a unique value for each user equipment. Further, M represents a temporal parameter for determining the validness of an index which is derived from Equation 4 below.

Referring to FIG. 4, in operation 401, the control unit 210 sets $N_P$ depending on the length N of the interleaver, and sets p in operation 403. In the present example, regardless of the user equipments, the user equipments all have an identical N value, all have an identical $N_P$ value, and all have an identical p value. Accordingly, all of the transmitters and receivers within the system can previously share N, $N_P$, and p.

In operation 405, the control unit 210 sets an interleaver index k by using the look-up table which includes a correlation between bit sequences according to a prime number value p.

In operation 407, the generation unit 250 calculates the value of c depending on the set interleaver index k. In the present example, the value of c can be calculated by Equation (4) below.

$$c = p^k \bmod N_P \quad (4)$$

In operation 409, the generation unit 250 sets $i_{original}$ to 0, and calculates a temporal index M in operation 411. The temporal index M can be calculated by Equation 5 below.

$$M=[i_{original} \times c] \bmod N_P \quad (5)$$

In operation 413, the generation unit 250 compares the calculated value of the temporal index M with that of N. When M is greater than or equal to N, the generation unit 250 updates $i_{original}$ by adding 1 to $i_{original}$ in operation 415, again calculates the temporal index M by using the updated value in operation 411, and compares the value of M with that of N in operation 413. In contrast, when M is less than N, in operation 417, the generation unit 250 determines the calculated temporal index M as a valid index, and uses the calculated temporal index M as $i_{interleaved}$.

In operation 419, the generation unit 250 determines whether $i_{original}$ is equal to $N_P-1$ depending on the length N of an interleaver. In operation 415, the generation unit 250 completes the generation of interleaving bits when $i_{original}=N_P-1$, or the generation unit 250 updates $i_{original}$ by adding 1 to $i_{original}$ when $i_{original}$ is not equal to $N_P-1$. In operation 411, the generation unit 250 again calculates the temporal index M by using the updated value.

Accordingly, in operation 421, the generation unit 250 generates an interleaving pattern according to a bit index depending on $i_{interleaved}$. In operation 423, the generation unit 250 interleaves an input bit sequence according to the generated interleaving pattern, and outputs the interleaved bit sequence.

The above-described interleaving method can generate multiple different interleaved bit sequences by using different interleaver indices k's. In the present example, the number of different possible k's is equal to $N_P-1$, and the number of values of different possible interleaver seeds c's depending on the number of different possible k's that is equal to $N_P-1$, also becomes equal to $N_P-1$. At this time, when c=1, an interleaved bit sequence generated by the interleaving method is equal to a bit sequence before performing interleaving, and thus a case where c=1 is excluded from among possible seeds. Accordingly, the interleaving method can generate a maximum ($N_P-2$) number of different interleaved bit sequences.

Figure 5:
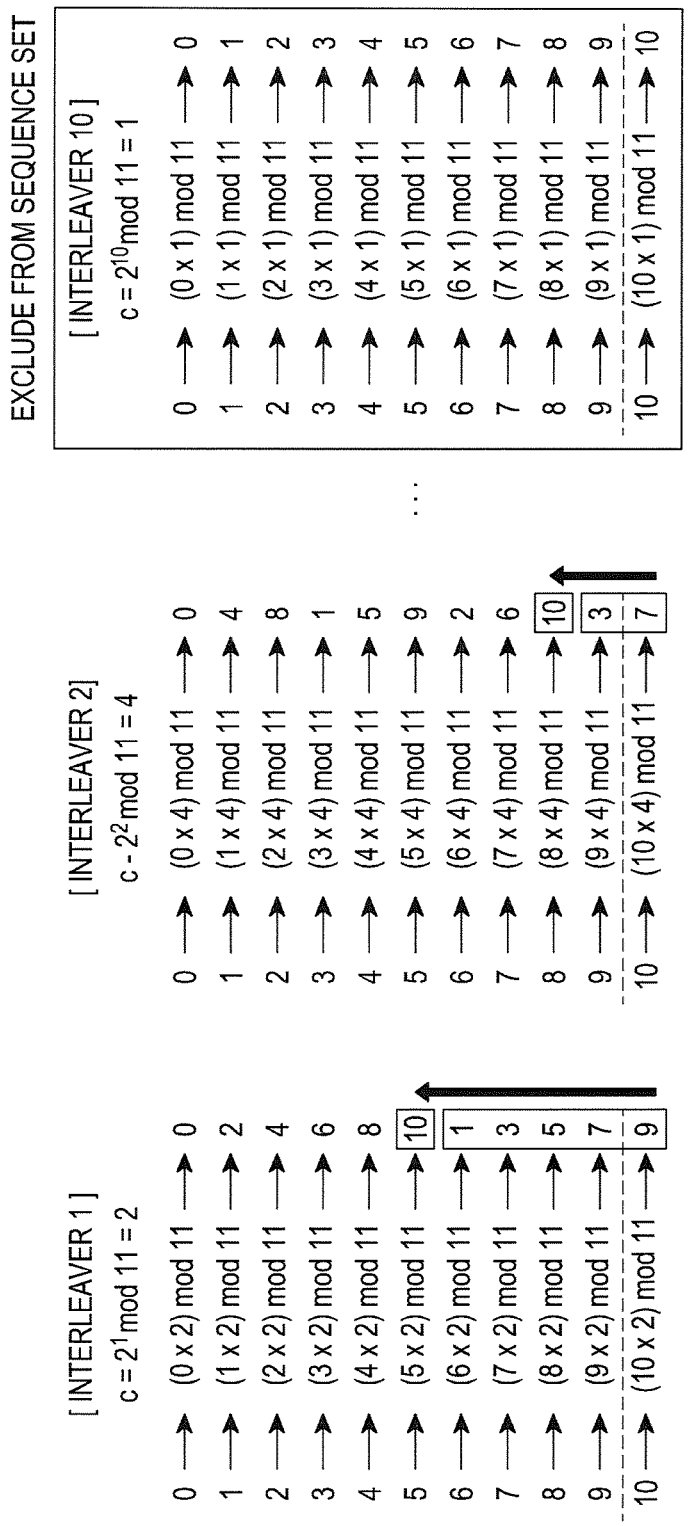
FIGS. 5 and 6 are views illustrating an example of an interleaving method according to an embodiment of the present disclosure.
Figure 6:
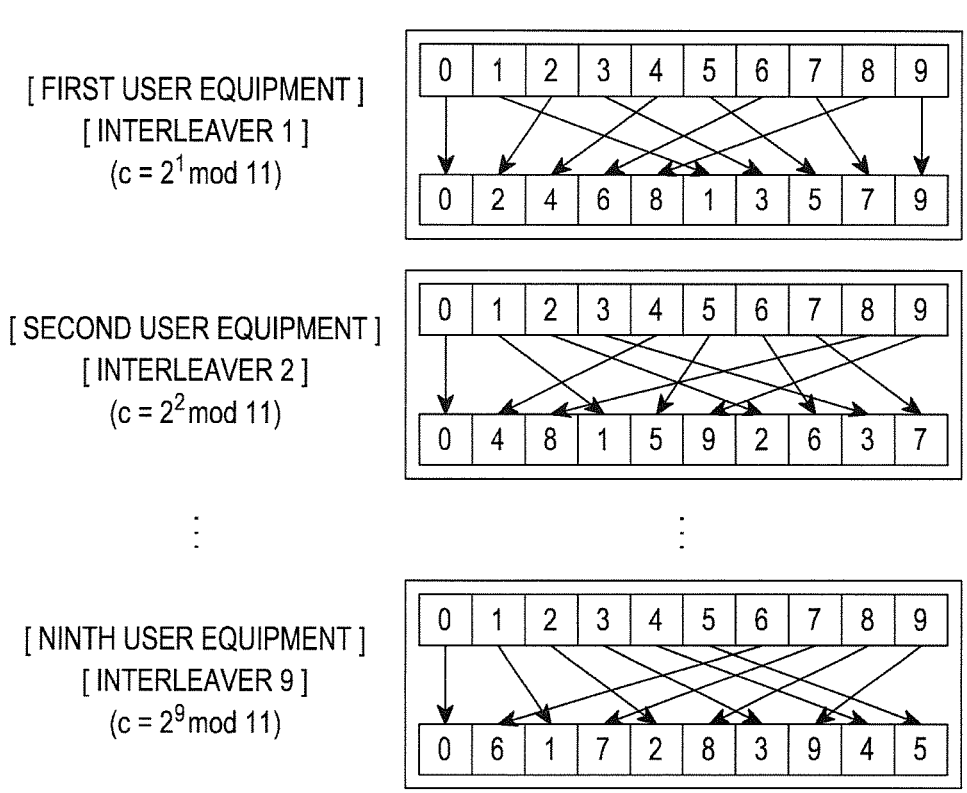

FIGS. 5 and 6 are views illustrating an example of an interleaving method according to an embodiment of the present disclosure.

In an embodiment of the present disclosure illustrated in FIGS. 5 and 6, a case is considered in which N=10, p=2, and K=3. Here, K represents the total number of user equipments (i.e., transmitters) in the communication system using the DMA technique. In this case, N=10 and thus $N_P$ is set to 11 according to a condition. Also, a case is considered in which each user equipment has previously received the value of k from the base station. Specifically, the case is considered in which k=1 for the first user equipment, k=2 for the second user equipment, and k=9 for the third user equipment.

As illustrated in FIG. 5, since $N_P=11$, the total number of interleaving bits that can be generated by the interleavers, is equal to 11−1=10, and there are a total of 9 possible interleaving bits when an interleaving bit 10 in the case of c=1 is excluded.

By using the interleaving method according to an embodiment of the present disclosure, an interleaver 1 calculates M as being 10 when $i_{original}=5$, and updates $i_{original}$ by adding 1 to each $i_{original}$ since M≥N. Accordingly, as illustrated in FIG. 5, indices which are greater than $i_{original}=5$ are shifted forward by one, one by one. Each of an interleaver 2 and an interleaver 3 performs interleaving as in the case of the interleaver 1. In other words, when $i_{interleaved}$ corresponding to $i_{original}$ is generated, if each of the interleaver 2 and the interleaver 3 deviates from a valid index, each of the interleaver 2 and the interleaver 3 disregards the generation of an index, and generates $i_{interleaved}$ corresponding to the next $i_{original}$. In the present example, $i_{interleaved}$ generated by the interleaving method is identical to $i_{original}$ when c=1, and thus $i_{interleaved}$ in the case where c=1 among possible seeds is excluded from a set of interleaved bit sequences.

The interleaved bit sequences generated as in the example illustrated in FIG. 5 have different interleaving patterns in the respective user equipments as illustrated in FIG. 6. Accordingly, in the interleaving method according to an embodiment of the present disclosure, the respective user equipments can perform interleaving in different interleaving patterns by using the common interleaving method, and thus each user equipment can generate an interleaved bit sequence at a low complexity level by using a minimum amount of a memory.

Figure 7:
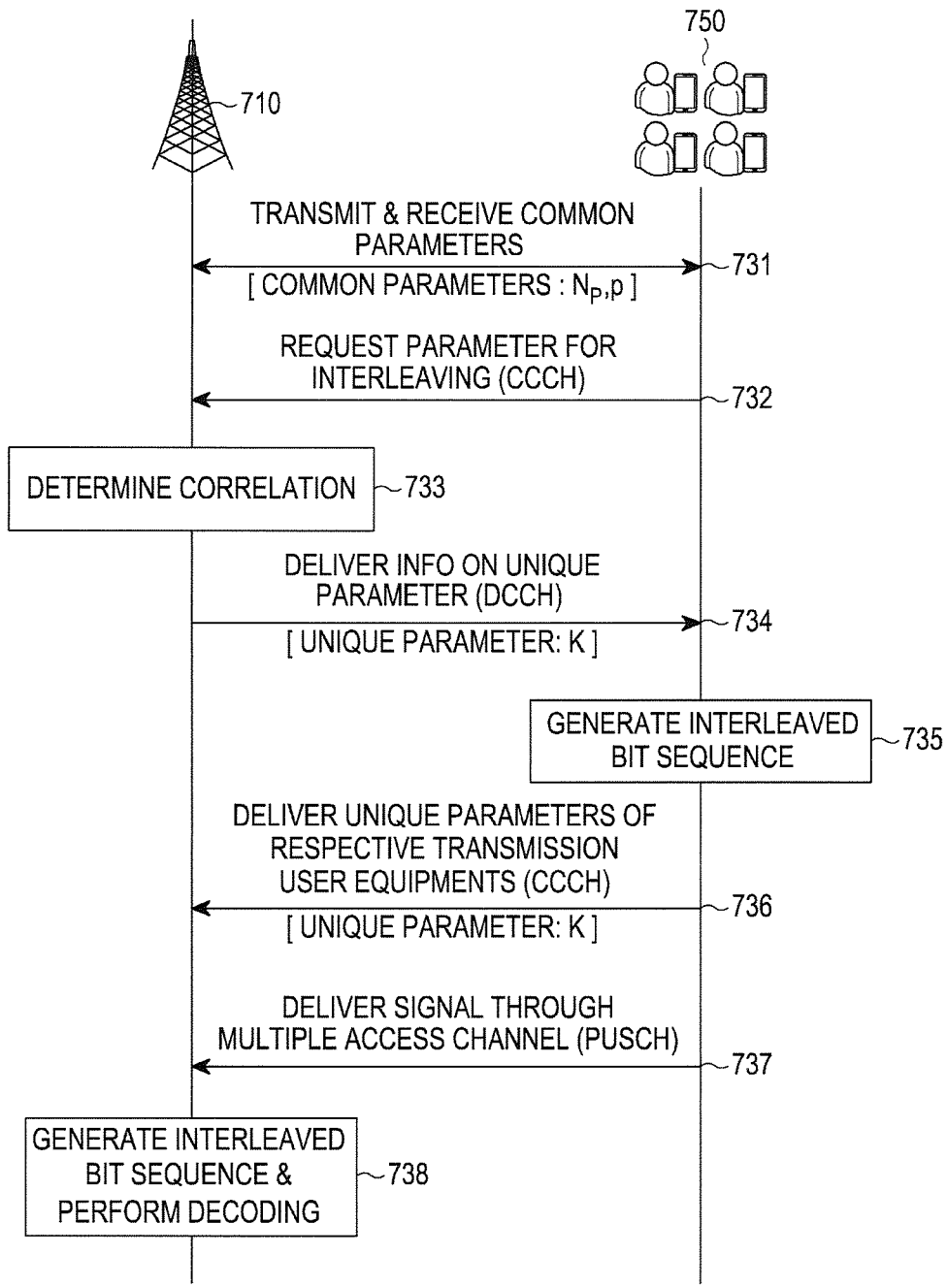
FIG. 7 is a signal flow diagram illustrating a method for transmitting and receiving information between a base station and multiple user equipments in a system according to an embodiment of the present disclosure.

FIG. 7 is a signal flow diagram illustrating a method for transmitting and receiving information between a base station and multiple user equipments in a system according to an embodiment of the present disclosure. In an embodiment of the present disclosure as illustrated FIG. 7, a cellular uplink that employs the communication system using the IDMA technique, will be described as an example. In this case, the transmission unit includes the multiple user equipments 750, and the reception unit includes the base station 710.

Referring to FIG. 7, in operation 731, the base station 710 and the multiple user equipments 750 that exist in a network, transmit and receive, therebetween, common parameters $N_P$ and p between the user equipments for performing interleaving. In operation 732, each of the multiple user equipments 750 sends, to the base station, a request for a unique parameter for generating an interleaved bit sequence unique to each user equipment. As an example, each of the user equipments which are Radio Resource Control (RRC)-connected to the base station 710 can request a unique parameter through a Common Control Channel (CCCH) of an uplink Medium Access Control (MAC) layer. As another example, each of the user equipments in an RRC-idle state with the base station 710 can request a unique parameter in association with a preamble through a Random Access CHannel (RACH).

In operation 733, the base station 710 identifies a correlation between bit sequences depending on p, which is a common parameter, in a look-up table in response to the request for the unique parameter received from each of the user equipments 750, and sets the value of k for each of the user equipments 750. At this time, a complexity level, which is required to measure a correlation and to compare the correlations, can become higher as the number of interleaver candidate groups increases. However, the length of an interleaver and parameters required to generate an interleaver are identical in all of the networks, so that the complexity level can be reduced. As an example, a correlation between interleavers according to p with respect to a transmission block length and the iterative number of times of an iterative code, which are agreed upon by standards, can be pre-stored in the form of a look-up table. Accordingly, a complex calculation procedure for setting the correlation can be significantly reduced.

In operation 734, the base station 710 transmits, to the relevant user equipment, the value of k for each of the user equipments 750. As an example, the base station 710 can define a new Downlink Control Information (DCI) format for transmitting a unique parameter of a user equipment, and can transmit the defined new DCI format to the user equipment in an RRC-idle state through a Physical Downlink Control Channel (PDCCH). As another example, the base station 710 can transmit a unique parameter of a user equipment to the user equipment in the RRC-connected state through a Dedicated Control CHannel (DCCH) of a MAC layer.

In operation 735, each of the user equipments 750 generates an interleaved bit sequence by using Equation 3 and Equation 4 on the basis of the common parameter and the unique parameter received from the base station 710. In operation 736, each of the user equipments 750 transmits, to the base station 710, information on the unique parameter used during the generation of the interleaved bit sequence. As an example, as described above, each of the user equipments in the RRC-connected state can transmit information on the unique parameter to the base station 710 through a CCCH of an uplink MAC layer. As another example, each of the user equipments in the RRC-idle state can transmit, to the base station 710, information on the unique parameter in association with a Reference Signal (RS), which is used for channel estimation, and interleaver information through a Physical Uplink Shared CHannel (PUSCH).

In operation 737, each of the user equipments 750 transmits, to the base station 710, a signal including message information that is intended to be actually transmitted, through the PUSCH. In operation 738, the base station 710 receives the signals that include the pieces of message information, in an overlapping form through a multiple access channel, and decodes the received signals by using the information on the unique parameter received from each of the user equipments 750.

FIG. 8 is a view illustrating a comparison between a memory usage of a conventional interleaver and that of an interleaver according to an embodiment of the present disclosure. FIG. 9 is a view illustrating a comparison between the complexity level of a conventional interleaver and that of an interleaver according to an embodiment of the present disclosure.

Referring to FIG. 8, memory requirements for storing a pattern of interleaved bits is related to the amount of a memory that the reception unit requires to store a unique interleaving method of a user equipment in the communication system. A conventional random interleaver optionally generates different interleaved bit sequences of a user equipment, and thus increases the memory requirements in proportion to the number of user equipments. Also, a conventional power interleaver selects one random interleaver as a master interleaver and generates different interleaver patterns, and thus requires one memory, that is to store an optional interleaver pattern, as the master interleaver regardless of the number of user equipments. The PP interleaver, according to an embodiment of the present disclosure, generates an interleaved bit sequence by using a unique parameter k for each user equipment, and thus requires one memory that stores parameters.

Referring to FIG. 9, a complexity level of generation of an interleaved bit sequence is related to the average number of times of interleaving per user equipment which is required to generate an interleaved bit sequence of each user equipment. Each of the conventional random interleaver and the PP interleaver according to an embodiment of the present disclosure performs interleaving once per user equipment, whereas the conventional power interleaver increases the number of times of interleaving in proportion to a user equipment index.

Accordingly, when generating an interleaved bit sequence, the PP interleaver, according to an embodiment of the present disclosure, can reduce the complexity level of the generation of an interleaved bit sequence while using a less memory usage than the conventional interleavers.

Figure 11A:
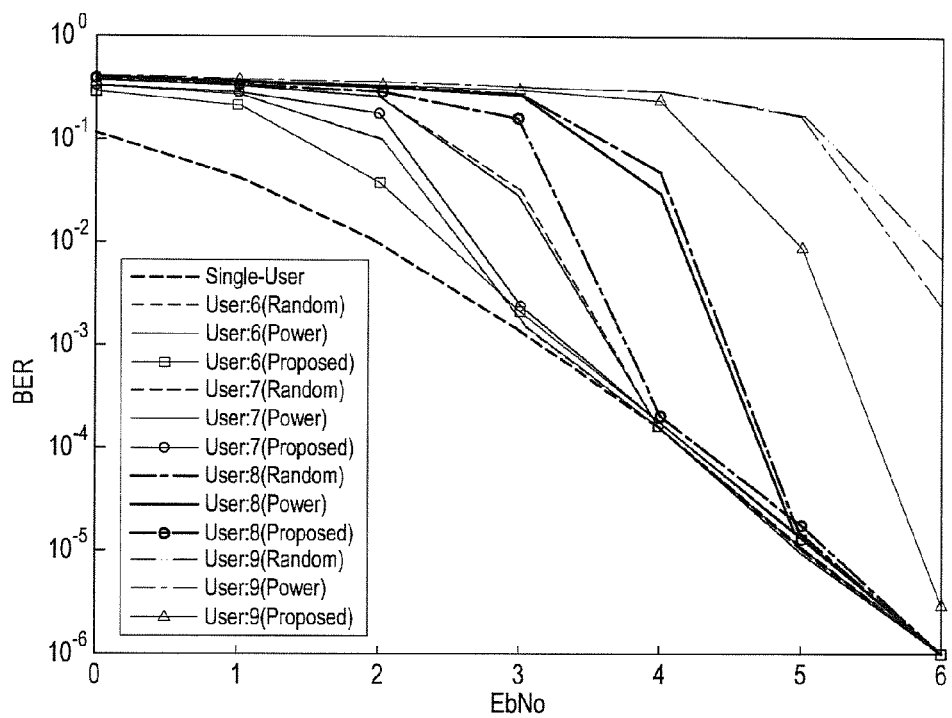
Figure 11B:
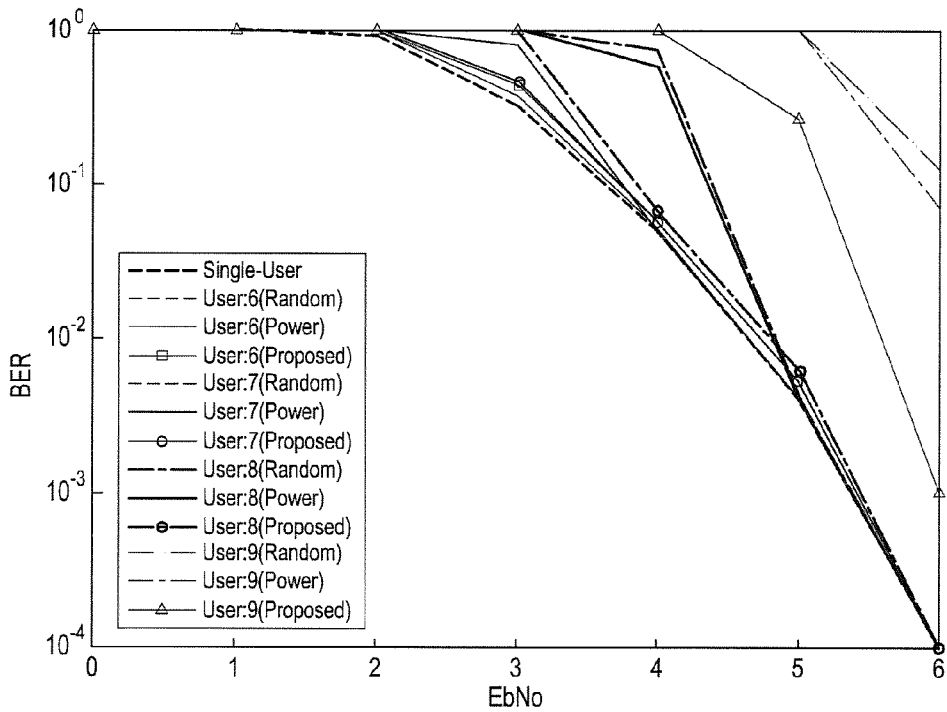

FIGS. 10, 11A and 11B are views illustrating the estimation of the performance of an interleaver according to an embodiment of the present disclosure.

In FIG. 10, an environment is illustrated for estimating the performance of an interleaver, and a case is considered in which a transmitter and a receiver both know Channel State Information (CSI) and interleaver information between the transmitter and the receiver. Also, a common parameter p, which is used in an embodiment of the present disclosure, is considered to be equal to 2, and interleavers respectively corresponding to user equipments are selected as interleavers having small numerical values according to a correlation measurement method. A Bit Error Rate (BER) performance and a Block Error Rate (BLER) performance of the IDMA technique are classified according to multiple access user equipments and the respective interleavers, and the performance of a single user equipment is set as a comparative group. Accordingly, as a gain of a Multi-User (i.e., a user equipment) Detection (MUD) of the IDMA technique becomes larger, the BER performance and the BLER performance of a multi-user equipment come closer to the performance of the single user equipment.

FIGS. 11A and 11B illustrate the results of estimating a BER performance and a BLER performance according to scenario #01 of FIG. 10, and performance estimation is performed on a relatively long message length of 1024. Also, in FIGS. 11A and 11B, the number of multiple access user equipments is set to 6 to 9, the random interleaver is represented by a dotted line, the power interleaver is represented by a solid line, and the PP interleaver according to an embodiment of the present disclosure is represented by a solid line having square-shaped marks.

As illustrated in FIGS. 11A and 11B, it can be noted that the BER performance and the BLER performance of the communication system, to which the PP interleaver according to an embodiment of the present disclosure is applied, are better than those of the conventional interleaver. Particularly, the performance of the PP interleaver, according to an embodiment of the present disclosure, compared to that of the random interleaver shows a MUD gain of about 0.1 to 0.5 dB with a BER of 0.01 as a reference, and shows a MUD gain of about 0.2 to 1 dB with a BLER of 0.1 as a reference.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for interleaving an input bit sequence by an interleaver of a communication system including multiple interleavers, the method comprising:
   setting, by the interleaver of the communications system, a common parameter received from a base station, wherein the common parameter is to be used by the multiple interleavers and includes a transmission block length of each of the multiple interleavers and a prime seed value;

setting, by the interleaver, a unique parameter for the interleaver received from the base station, wherein the unique parameter is set in view of a correlation between bit sequences that are input to the multiple interleavers;

calculating an information value of the interleaver by using the common parameter and the unique parameter;

calculating a temporal index by using the information value of the interleaver;

comparing, by the interleaver, the transmission block length for the interleaver with the temporal index which is determined based on the common parameter and the unique parameter;

generating, by the interleaver, an interleaving pattern based on a result of the comparison; and interleaving, by the interleaver, the input bit sequence according to the generated interleaving pattern by using a prime-power based on the common parameter and the unique parameter.

2. The method as claimed in claim 1, wherein the unique parameter corresponds to a value of a power applied to the prime-power.

3. The method as claimed in claim 1, wherein the generating of the interleaving pattern comprises:

updating an index of input bits when the temporal index is greater than or equal to the transmission block length for the interleaver as a result of the comparison, and calculating a new temporal index by using the updated index;

determining the temporal index as a valid index when the temporal index is less than the transmission block length for the interleaver; and generating the interleaving pattern based on the determined valid index.

4. The method as claimed in claim 3, wherein the interleaving of the input bit sequence is completed when the updated index is less by 1 than a smallest value among prime numbers greater than or equal to the transmission block length for the interleaver.

5. The method as claimed in claim 1, wherein, in the calculating of the information value of the interleaver, the information value of the interleaver is calculated by:

$$c=p^k \bmod N_P,$$

wherein p represents the common parameter, k represents the unique parameter, and $N_P$ represents a smallest value among prime numbers that cause an updated index to be greater than or equal to the transmission block length for the interleaver.

6. The method as claimed in claim 3, wherein, in the calculating of the temporal index, the temporal index is calculated by:

$$M=[i_{original} \times c] \bmod N_P,$$

wherein $i_{original}$ represents an index of the input bits, and $N_P$ represents a smallest value among prime numbers greater than or equal to the transmission block length for the interleaver.

7. The method as claimed in claim 1, wherein the correlation between the bit sequences, that are input to the multiple interleavers, is pre-stored in a look-up table for prime values.

8. The method as claimed in claim 1, wherein the communication system corresponds to a communication system using an Interleave Division Multiple Access (IDMA) technique.

9. An apparatus for interleaving an input bit sequence in a communication system, the apparatus comprising:

a transceiver; and
a processor configured to:
set a common parameter received from a base station, wherein the common parameter is to be used by multiple interleavers and includes a transmission block length of each of the multiple interleavers and a prime seed value, set a unique parameter received from a base station, wherein the unique parameter is set in view of a correlation between bit sequences that are input to the multiple interleavers, calculate an information value of the interleaver by using the common parameter and the unique parameter, calculate a temporal index by using the information value of the interleaver, compare the transmission block length with the temporal index which is determined based on the common parameter and the unique parameter, generate an interleaving pattern based on a result of the comparison, and interleave the input bit sequence according to the generated interleaving pattern by using prime-power based on the common parameter and the unique parameter.

10. The apparatus as claimed in claim 9, wherein the unique parameter corresponds to a value of a power applied to the prime-power.

11. The apparatus as claimed in claim 9, wherein the processor is further configured to:

update an index of input bits when the temporal index is greater than or equal to the transmission block length as a result of the comparison;

calculate a new temporal index by using the updated index;

determine the temporal index as a valid index when the temporal index is less than the transmission block length; and generate the interleaving pattern based on the determined valid index.

12. The apparatus as claimed in claim 11, wherein the processor is further configured to complete the interleaving of the input bit sequence when the updated index is less by 1 than a smallest value among prime numbers greater than or equal to the transmission block length.

13. The apparatus as claimed in claim 9, wherein the information value is calculated by:

$$c=p^k \bmod N_P,$$

where p represents the common parameter, k represents the unique parameter, and $N_P$ represents a smallest value among prime numbers that cause an updated index to be greater than or equal to the transmission block length.

14. The apparatus as claimed in claim 11, wherein the temporal index is calculated by:

$$M=[i_{original} \times c] \bmod N_P,$$

where $i_{original}$ represents an index of the input bits, and $N_P$ represents a smallest value among prime numbers greater than or equal to the transmission block length.

15. The apparatus as claimed in claim 9, wherein the correlation between the bit sequences that are input to the multiple interleavers, is pre-stored in a look-up table for prime values.

16. The apparatus as claimed in claim 9, wherein the communication system is configured to correspond to a communication system using an Interleave Division Multiple Access (IDMA) technique.

* * * * *